United States Patent [19]
Cook et al.

[11] Patent Number: 6,001,702
[45] Date of Patent: Dec. 14, 1999

[54] METAL TO METAL CAPACITOR AND METHOD FOR PRODUCING SAME

[75] Inventors: Robert K. Cook, Poughkeepsie; Craig R. Gruszecki, Hopewell Junction; Mark A. Passaro, Hopewell Junction; Frederick A. Scholl, Hopewell Junction, all of N.Y.

[73] Assignee: International Business Machines Corporation, Armonk, N.Y.

[21] Appl. No.: 09/014,934

[22] Filed: Jan. 28, 1998

Related U.S. Application Data

[62] Division of application No. 08/769,288, Dec. 18, 1996.

[51] Int. Cl.$^6$ .................................................. H01L 21/20
[52] U.S. Cl. ........................ 438/393; 438/633; 438/622; 438/672; 438/685; 438/687; 438/688
[58] Field of Search ..................... 257/296, 310, 257/306; 438/386, 396, 672, 622, 633, 637, 669, 685, 687, 688, 253, 243, 244, 387

[56] References Cited

U.S. PATENT DOCUMENTS

| | | | |
|---|---|---|---|
| 5,478,772 | 12/1995 | Fazan | 438/396 |
| 5,563,762 | 10/1996 | Lueng et al. | 361/301.4 |
| 5,622,893 | 4/1997 | Summerfelt et al. | 438/396 |
| 5,736,448 | 4/1998 | Saia et al. | 438/393 |

*Primary Examiner*—Carl Whitehead, Jr.
*Assistant Examiner*—Toniae M. Thomas
*Attorney, Agent, or Firm*—McGinn & Gibb, P.C.; Richard M. Kotulak, Esq.

[57] ABSTRACT

The present invention provides a method for fabricating a capacitor within a semiconductor device comprising the steps of forming openings in an oxide dielectric to reach a lower conductor layer which will serve as a lower conductor plate of the capacitor; depositing capacitor electrode material, such as tungsten to fill the openings to form a capacitor electrode and planarizing the filled openings using chemical/mechanical polish; depositing a selected oxide capacitor dielectric over the capacitor electrodes and patterning the capacitor dielectric with photoresist to leave dielectric covering the area of the capacitor electrodes; stripping away the photoresist; adding an upper conductor layer on top of the capacitor dielectric to serve as the top plate of the capacitor. The above steps may be repeated to form multiple layers of capacitors within the semiconductor device.

20 Claims, 3 Drawing Sheets

METAL TO METAL CAPACITOR AND METHOD FOR PRODUCING SAME

This application is a division of application Ser. No. 08/769,288, filed Dec. 18, 1996.

FIELD OF THE INVENTION

The present invention relates to semiconductor devices, electronic packages, or other structures with more than one vertically stacked plane of thin-film conductor wiring. More particularly, the invention relates to a capacitor used in such a device, and the method for producing the capacitor.

BACKGROUND OF THE INVENTION

Generally, semiconductor devices contain multiple levels of conductor wiring. As lithographic dimensions have reduced, and the degree of device integration has increased, these structures have become increasingly planar. This trend is projected to continue into the sub 0.25 micron regime by most major semiconductor fabricators.

One disadvantage of this industry trend is that the relatively thick dielectric layers necessary to reduce parasitic wiring capacitance make the incorporation of intentional conductor to conductor capacitors very area intensive. This is compounded by relatively poor capacitance tracking due to thickness variation in the planarized dielectrics. Capacitive elements are critical to many circuit applications. High capacitance per unit area is essential for cost effective design.

Previous versions of thin film capacitor devices were found unsatisfactory because of capacitor dielectric defects due to irregularities in an etched metal capacitor plate, dielectric defects at the edge of the capacitor plate, and leakage around the capacitor plate because of conductive residues.

SUMMARY OF THE INVENTION

It is an object of the present invention to provide a semiconductor capacitor device that operates reliably and effectively.

A further object of the invention is to provide a method for fabricating a capacitor within a semiconductor device that is easy to implement and does not increase the total processing time significantly.

The present invention provides a method for fabricating a capacitor within a semiconductor device comprising the steps of forming openings in an oxide dielectric to reach a lower conductor layer; depositing capacitor electrode material, such as tungsten to fill the openings to form a capacitor electrode and planarizing the filled openings using chemical/mechanical polish; depositing a selected oxide capacitor dielectric over the capacitor electrodes and patterning the capacitor dielectric with photoresist to leave dielectric covering the area of the capacitor electrodes; stripping away the photoresist; and adding an upper conductor layer on top of the capacitor dielectric to serve as the top plate of the capacitor. The above steps may be repeated to form multiple layers of capacitors within the semiconductor device.

The foregoing method is easy to implement and can be done at low cost. The capacitor that results from the above method is reliable and effective. The known problems of metal-to-metal cap process defects are avoided. Moreover, capacitance tracking across the chip is improved.

DETAILED DESCRIPTION OF A PREFERRED EMBODIMENT OF THE INVENTION

Figure 1:
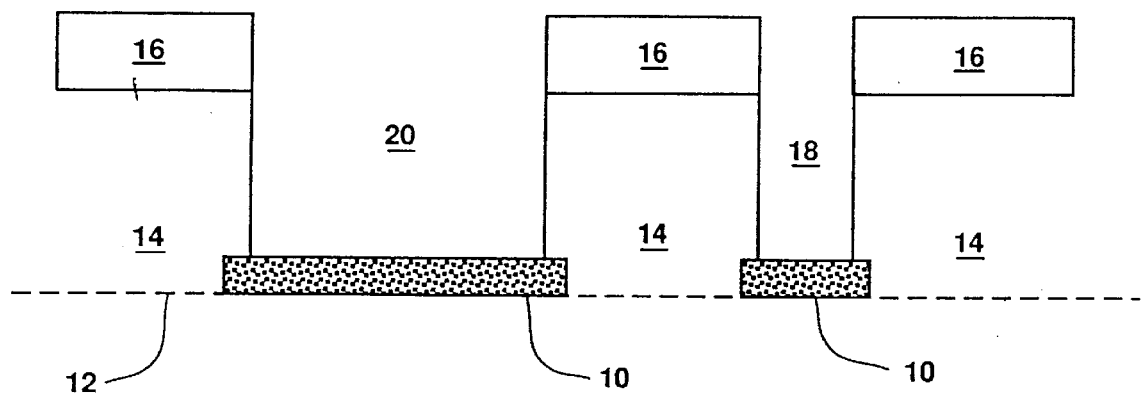
FIG. 1 is a depiction of a step in the method of the present invention.

The invention is best understood by reference to the accompanying drawings. FIG. 1 depicts the first step in the method of the present invention. FIG. 1 contemplates that complimentary metal oxide semiconductor ("CMOS") processing, which is well known in the art (or other semiconductor or thin film wiring process), has progressed such that a conductor layer 10 forms a lower level 12. On top of the lower level 12 is an oxide dielectric 14. On top of the oxide dielectric 14 is a layer of photoresist 16. As shown in FIG. 1, one or more oxide openings 18 and 20 are created in the oxide dielectric 14 by "cutting through" the oxide dielectric 14 through a patterned photoresist layer 16 to expose, at the bottom of the oxide openings 18 and 20, the conductor layer 10. In the preferred embodiment of the invention, the conductor layer 10 is aluminum. Other suitable conductor materials are copper, tungsten, gold, single crystal, or polysilicon, and silicon alloys such as titanium silicide. In the preferred embodiment of the invention, the oxide openings 18 and 20 are created using reactive ion etch.

Figure 2:
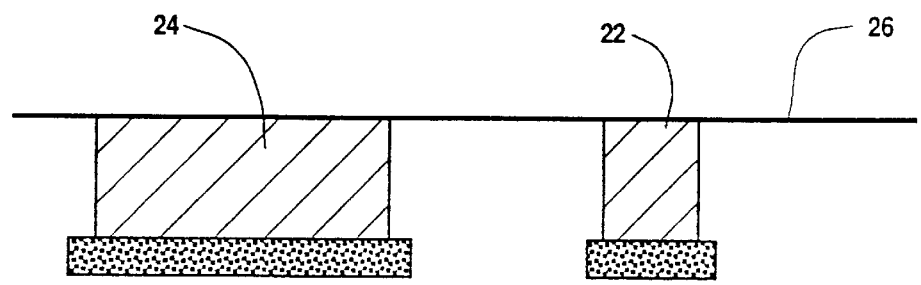
FIG. 2 is a depiction of another step in the method of the present invention.

Referring now to FIG. 2, the oxide openings 18 and 20 can be formed for use either as an inter-level via 22 or as a capacitor electrode 24. Since the formation of via openings, such as inter-level via 22 already is provided in most processing lines, little or no re-tooling will be required to implement the present invention. In FIG. 2, oxide openings 18 and 20 are filled with tungsten. Tungsten is used in the preferred embodiment of the invention for the capacitor electrode 24. Other materials suitable as capacitor electrode material are aluminum, copper, or other readily planarized conductor materials. The upper surface 26 then is planarized by chemical/mechanical polishing. The polishing provides a smooth capacitor electrode 24, and minimizes discontinuities between the tungsten and the dielectric interface.

Figure 3:
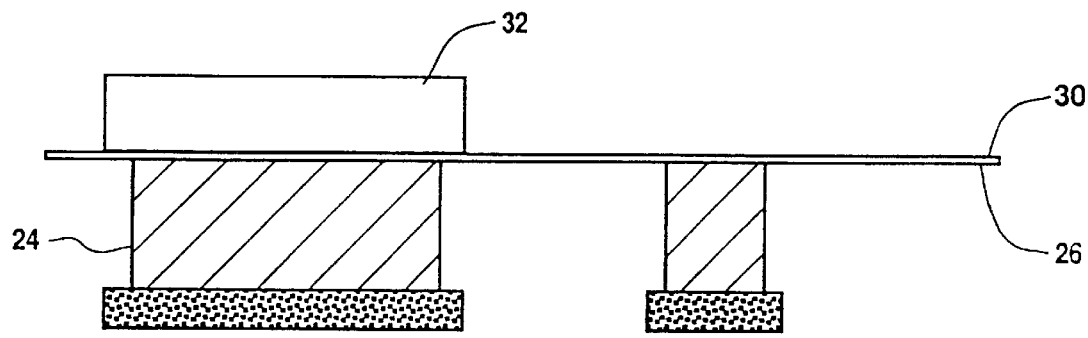
FIG. 3 is a depiction of another step in the method of the present invention.

FIG. 3 shows the next step in the method. As shown in FIG. 3, an oxide capacitor dielectric 30 is deposited on upper surface 26. In the preferred embodiment of the invention, the oxide capacitor dielectric 30 is silicon dioxide. The capacitor dielectric 30 can be formed from any single or composite dielectric of any thickness. In the preferred embodiment of the invention, the thickness of the layer of capacitor dielectric is 300 to 1800 Angstroms. Examples of other suitable capacitor dielectric 30 material include, but are not limited to silicon nitride and silicon oxy-nitride. The polishing of the upper surface 26 promotes a strong and even bond between the capacitor dielectric 30 and the capacitor electrode 24. Photoresist 32 then is layered on top of the capacitor dielectric 30. The photoresist 32 is patterned such that capacitor dielectric 30 completely covers the capacitor electrode 24. The photoresist 32 then is stripped away.

Figure 4:
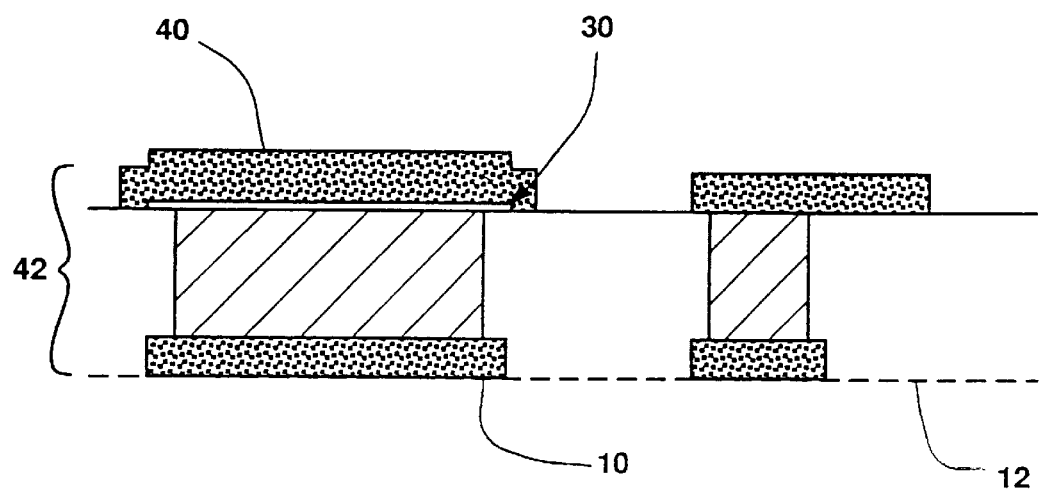
FIG. 4 is a depiction of another step in the method of the present invention.

As shown in FIG. 4, a second conductor layer 40 is formed by depositing a conducting material on top of the patterned layer of capacitor dielectric 30. Conductor layer 40 may form a lower plate of a second capacitor electrode. Conductor layer 40 also serves as the top plate of the capacitor 42 formed with conductive layer 10 as the lower level 12.

Figure 5:
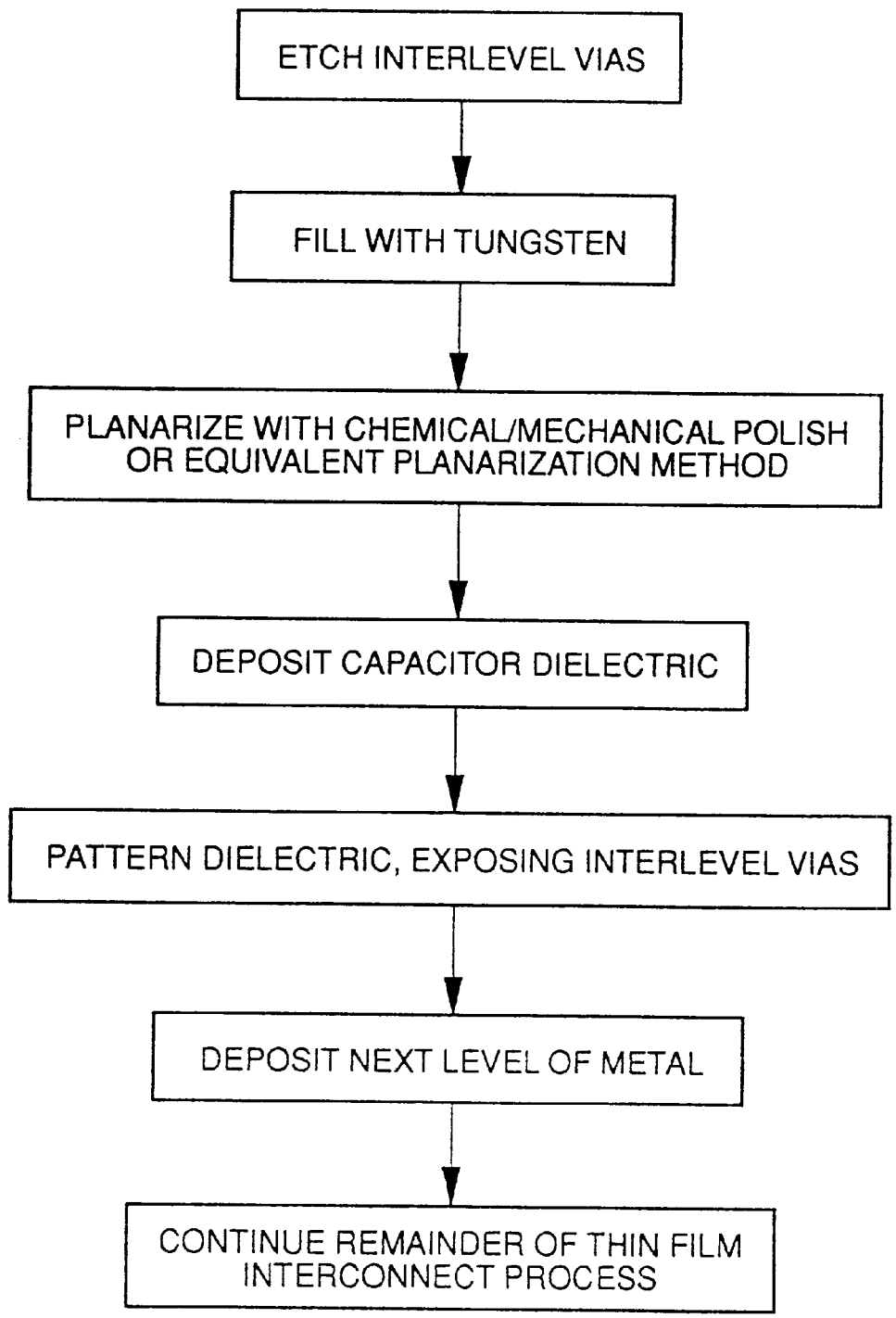
FIG. 5 is a flowchart summarizing the method of the present invention.

FIG. 5 is a flowchart of the method of the present invention.

The method of the present invention can be implemented at low cost. Known metal-to-metal cap process defects are avoided. Capacitor tracking across the chip is improved. Moreover, the yield is improved. For example, over 600 sites, a 1 volt yield of 100%, and a 40 volt yield of 99.6% was achieved for a 1,000 angstrom silicon dioxide dielectric.

The invention has been described with particularity. Those skilled in the art will know that modifications are possible that do not depart from the spirit or scope of the invention. Thus, the invention is limited only by the following claims and their equivalents.

What is claimed is:

1. A method for forming a capacitor in a semiconductor device or other thin film wiring structure comprising the steps of:

forming one or more oxide openings in an oxide dielectric until a lower conductor level is exposed at the bottom of each opening;

depositing a capacitor electrode material in each oxide opening to be used as a capacitor electrode until the oxide opening is full and planarizing the filled oxide openings to form a smooth surface;

depositing a dielectric material on top of the smooth surface, such that said dielectric material physically contacts said capacitor electrode;

applying and patterning photoresist on top of the dielectric material such that each capacitor electrode is covered by said photoresist;

patterning said dielectric material using said photoresist to form a patterned dielectric layer;

stripping away the photoresist; and applying an upper level conductor on top of the patterned dielectric material.

2. The method of claim 1 wherein one or more of said lower conductor level, said capacitor electrode and said upper level conductor comprise a metal.

3. The method of claim 2 wherein the metal comprises copper, aluminum, or tungsten.

4. The method of claim 1 wherein one or more of said lower conductor level, said capacitor electrode and said upper level conductor comprise a silicon material.

5. The method of claim 4 wherein the silicon material comprises polysilicon or single crystal silicon.

6. The method of claim 1 wherein the capacitor electrode material comprises tungsten.

7. The method of claim 1 wherein said planarization comprises chemical/mechanical polishing.

8. A method for forming a capacitor in a semiconductor device or other thin film wiring structure comprising the steps of:

forming one or more oxide openings in an oxide dielectric until a lower conductor level is exposed at the bottom of each opening;

depositing a capacitor electrode material in each oxide opening to be used as a capacitor electrode until the oxide opening is full and planarizing the filled oxide openings to form a smooth surface;

depositing a dielectric material on top of the smooth surface;

applying and patterning photoresist on top of the dielectric material such that each capacitor electrode is covered by said photoresist;

patterning said dielectric material using said photoresist to form a patterned dielectric layer;

stripping away the photoresist; and applying an upper level conductor on top of the patterned dielectric material, wherein the dielectric material is silicon dioxide.

9. The method of claim 1 wherein the dielectric material is in the range of 300 to 1800 Angstroms thick.

10. The method of claim 8 wherein one or more of said lower conductor level, said capacitor electrode and said upper level conductor comprise a metal.

11. The method of claim 10 wherein said metal comprises copper, aluminum, or tungsten.

12. The method of claim 8 wherein one or more of said lower conductor level, said capacitor electrode and said upper level conductor comprise a silicon material.

13. The method of claim 12 wherein said silicon material comprises polysilicon or single crystal silicon.

14. The method of claim 8 wherein said capacitor electrode material comprises tungsten.

15. The method of claim 8 wherein said planarization comprises chemical/mechanical polishing.

16. A method of forming an integrated circuit comprising:

forming a first dielectric layer over a lower conductor layer;

forming at least one opening in said first dielectric layer to expose at least a portion of said lower conductor level;

filling said opening with a capacitor electrode;

planarizing said first dielectric layer and said capacitor electrode to form a smooth surface;

forming a second dielectric layer on top of said smooth surface, such that said second material physically contacts said capacitor electrode;

patterning said second dielectric layer such that said capacitor electrode remains covered by said second dielectric layer; and forming an upper level conductor over said second dielectric material and said first dielectric material.

17. The method of claim 16 wherein at least one of said lower conductor level, said capacitor electrode and said upper level conductor comprise copper, aluminum, or tungsten.

18. The method of claim 16 wherein at least one of said lower conductor level, said capacitor electrode and said upper level conductor comprise polysilicon or single crystal silicon.

19. The method of claim 16 wherein said capacitor electrode comprises tungsten.

20. The method of claim 16 wherein said planarizing comprises chemical/mechanical polishing.

* * * * *